United States Patent
Haddad et al.

(10) Patent No.: US 6,249,125 B1
(45) Date of Patent: Jun. 19, 2001

(54) TEST SYSTEM FOR DETECTING DEFECTIVE BATTERIES

(75) Inventors: Michel Haddad, Austin; Marc Marini, New Brauntels, both of TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 09/517,935

(22) Filed: Mar. 3, 2000

(51) Int. Cl.$^7$ .......................... H02J 7/00; G01N 27/416
(52) U.S. Cl. .................. 324/426; 320/116; 320/119; 702/63
(58) Field of Search ...................... 320/116, 119; 324/426; 702/63

(56) References Cited

U.S. PATENT DOCUMENTS

| | | | |
|---|---|---|---|
| 5,710,503 | 1/1998 | Sideris et al. | 324/431 |
| 6,094,030 | 7/2000 | Gunthrope et al. | 320/116 |

Primary Examiner—Peter S. Wong
Assistant Examiner—Gregory J. Toatley, Jr.

(74) Attorney, Agent, or Firm—Conley, Rose & Tayon PC; Jeffrey C. Hood

(57) ABSTRACT

A system and method that reduces system cost in testing defective batteries. In a particular embodiment, a test system may be configured to reduce system cost by wiring two-wire relays from a plurality of batteries to a plurality of multiplexers located in a first stage. The number of two-wire relays is equal to:

$B/2+4.5$ if B is odd
$B/2+5$ if B is even where B is the number of batteries. The batteries may be associated with a particular combination of input channels of the multiplexers located in the first stage. The outputs of the multiplexers located in the first stage may then be connected to the inputs of at least one multiplexer located in a second stage. The outputs of the at least one multiplexer located in the second stage may then be connected to at least one instrument, such as a multimeter. Since each battery may be associated with a particular combination of input channels of multiplexers located in the first stage, software may be used to select the particular combination of input channels to be measured by the at least one instrument. The at least one instrument compares the voltage between a particular combination of input channels of multiplexers located in the first stage with an expected value. If the voltage of the particular combination of input channels is less than the expected value, then that particular battery is defective.

20 Claims, 6 Drawing Sheets

TEST SYSTEM FOR DETECTING DEFECTIVE BATTERIES

FIELD OF THE INVENTION

The present invention relates to the field of test and measurement systems, and more particularly to a system and method that reduces the system cost of detecting defective batteries.

DESCRIPTION OF THE RELATED ART

Scientists and engineers often use test and measurement and data acquisition systems to perform a variety of functions, including laboratory research, process monitoring and control, data logging, analytical chemistry, test and analysis of physical phenomena and control of mechanical or electrical machinery, to name a few examples. One example of hardware to implement such measuring systems is a computer-based measurement system or data acquisition (DAQ) system. A computer-based measurement or DAQ system typically includes transducers for measuring and providing electrical signals, signal conditioning hardware which may perform amplification, isolation and/or filtering, and measurement or DAQ hardware for receiving digital and analog signals and providing them to a processing system, such as a personal computer. The computer may further include analysis hardware and software for analyzing and appropriately displaying the measured data.

As mentioned above, a measurement system may include one or more of a measurement or DAQ device comprised in or connected to a computer system. The device may be an I/O board plugged into one of the I/O slots of the processing or computer system. The measurement or DAQ device may also comprise an external device connected to a computer system. Exemplary hardware I/O (input/output) interface options include the GPIB (general purpose interface bus), the VXI bus, the PXI bus, or a serial bus such as the RS-232 protocol, IEEE 1394, or USB. As one example, measurement systems can be configured to measure the voltages across batteries and determine if they are defective.

Batteries are comprised of cells connected together to furnish electric current. The current may then be used to provide power to a product. For example, batteries can be found in many types of products such as flashlights, cameras, automobiles, cordless phones, etc.

Prior to the consumer purchasing batteries or the supplier receiving batteries from a manufacturer, the batteries must be tested to ensure the batteries meet certain specifications. One of those specifications is that each battery exhibits a certain voltage. In one test configuration, the voltages of each battery may be tested by connecting a group of batteries in series and then measuring the voltage of each battery with rechargeable batteries connected to a charger. Batteries are connected in series in order to maximize production capacity on the charger system.

Batteries connected in series may be tested in various different configurations. One configuration is to connect each battery to a particular input channel of a single two-wire multiplexer where each input channel is a single pair of wires. The single two-wire multiplexer provides an interface between the batteries and a measurement instrument, such as a multimeter. However, the multiplexer architecture only allows a single pair of wires or a channel to be selected to route the battery voltage information to the instrument. A disadvantage of this configuration is that the number of multiplexer channels or single pair of wires equals the number of batteries.

Another configuration for testing batteries connected in series includes two single-wire multiplexers coupled to a measuring instrument, such as a digital multimeter. The first multiplexer is coupled to the positive terminal of the multimeter; whereas, the second multiplexer is coupled to the negative terminal of the multimeter. The batteries connected in series are connected to the two multiplexers in an arrangement where the positive terminals of the batteries placed in the odd number positions will be connected to the various input channels of the first multiplexer. The positive terminals of the batteries placed in the even number positions will be connected to the various input channels of the second multiplexer. Unfortunately, a disadvantage to this configuration is that the number of multiplexer channels or single-wire relays is equal to the number of batteries.

It would therefore be desirable to develop a system and method for testing a plurality of batteries that would reduce wiring and relays or switches in order to reduce system cost.

SUMMARY OF THE INVENTION

The problems outlined above are in large part solved by a system and method that reduces system cost in detecting defective batteries out of a plurality of batteries connected in series. According to one embodiment of the present invention, a plurality of multiplexers are connected to each battery by a plurality of wires. Each of the plurality of multiplexers comprises at least one two-wire relay. The number of two-wire relays is less than the number of the plurality of batteries when the number of batteries is eleven or greater. In the preferred embodiment, the number of two-wire relays is equal to:

B/2+4.5 if B is odd
B/2+5 if B is even where B is the number of batteries. Furthermore, at least one instrument, such as a multimeter, is connected to the outputs of at least one multiplexer of the plurality of multiplexers. The at least one instrument is configured to receive a voltage from each of the plurality of batteries and hence is operable to test each of the plurality of batteries.

In a particular embodiment of the present invention, each battery is connected to various input channels of a plurality of multiplexers located in a first stage. The outputs of multiplexers located in the first stage are connected to various input channels of at least one multiplexer located in a second stage. Each multiplexer of the plurality of multiplexers located in the first and second stage is comprised of at least one two-wire relay. The number of two-wire relays is less than the number of the plurality of batteries when the number of batteries is eleven or greater. Furthermore, each input channel of the multiplexers located in the first and second stage is connected to a two-wire relay. At least one instrument, such as a multimeter, is connected to the outputs of the at least one multiplexer located in the second stage. The at least one instrument is configured to receive a voltage from each of the plurality of batteries. The at least one instrument then compares the received voltage with a known range. If the received voltage is not within the known range, then the battery associated with the received voltage is defective.

In a particular embodiment of the present invention, the batteries may be associated with a particular combination of input channels of the multiplexers located in the first stage. Since each battery may be associated with a particular combination of input channels of multiplexers located in the first stage, software may be used to select the particular combination of input channels to measure. The at least one instrument compares the voltage between a particular combination of input channels of multiplexers located in the first stage with a known range. If the voltage of the particular combination of input channels of the multiplexers located in the first stage is not within the known range, then that particular battery is defective

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
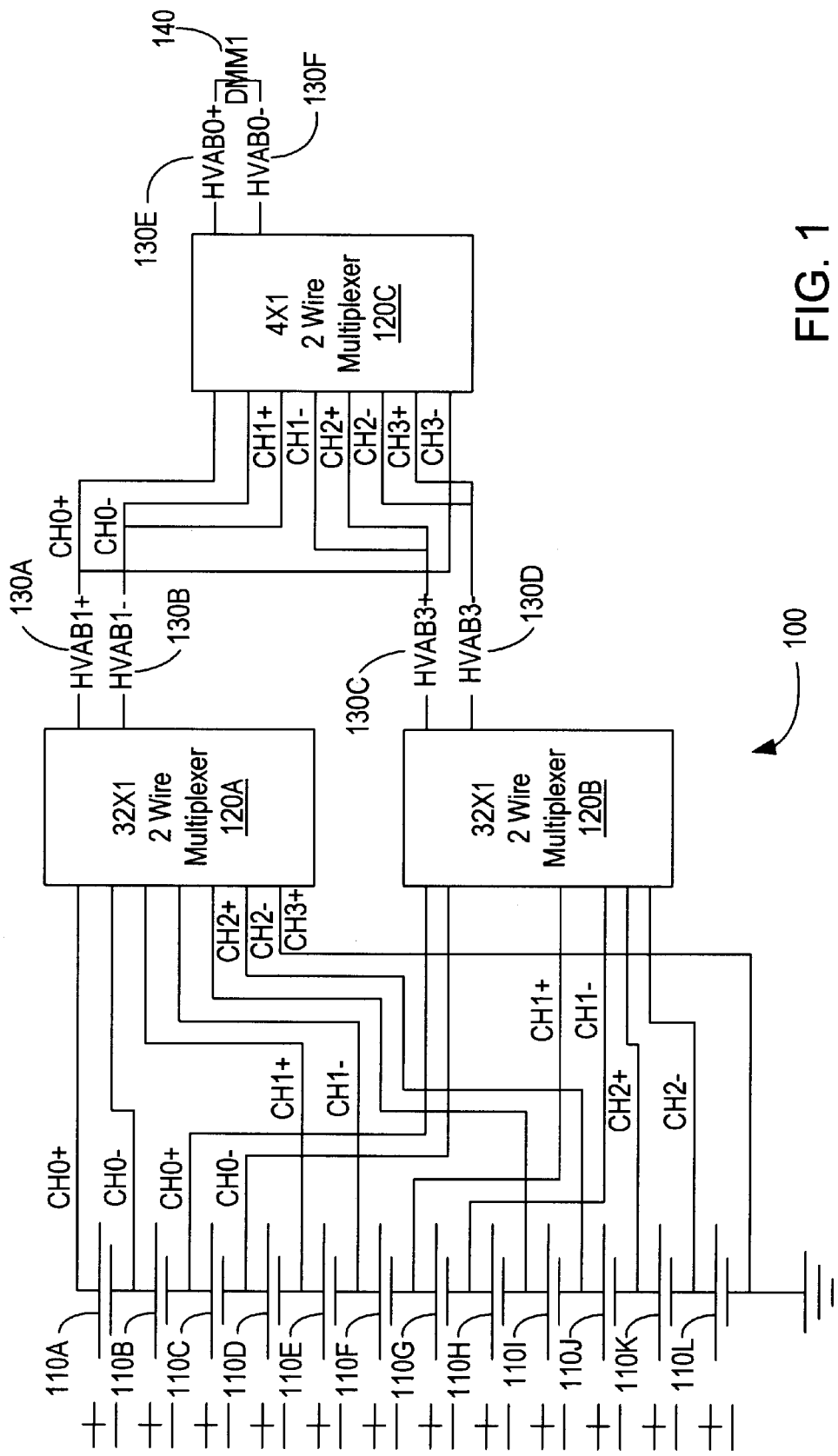
FIG. 1 illustrates a battery testing system according to an embodiment of the present invention.

The present invention comprises a system and method for testing a plurality of batteries with reduced system cost.
FIG. 1—Battery Test System FIG. 1 illustrates a battery test system 100 according to one embodiment of the present invention. The battery test system 100 comprises a plurality of batteries connected in series designated as 110A, 110B, 110C . . . 110L. Batteries 110A, 110B, 110C . . . 110L may be collectively referred to as batteries 110. It is noted that the battery test system 100 may comprise any number of batteries 110. It is further noted that batteries 110 may be any type of batteries such as five volt batteries, 12 volt batteries or batteries in the microvolt range. The plurality of batteries 110 may be tested to determine if there are any defective batteries. That is, the system described herein may operate to identify any battery 110 that does not supply the requisite voltage.

Figure 2:
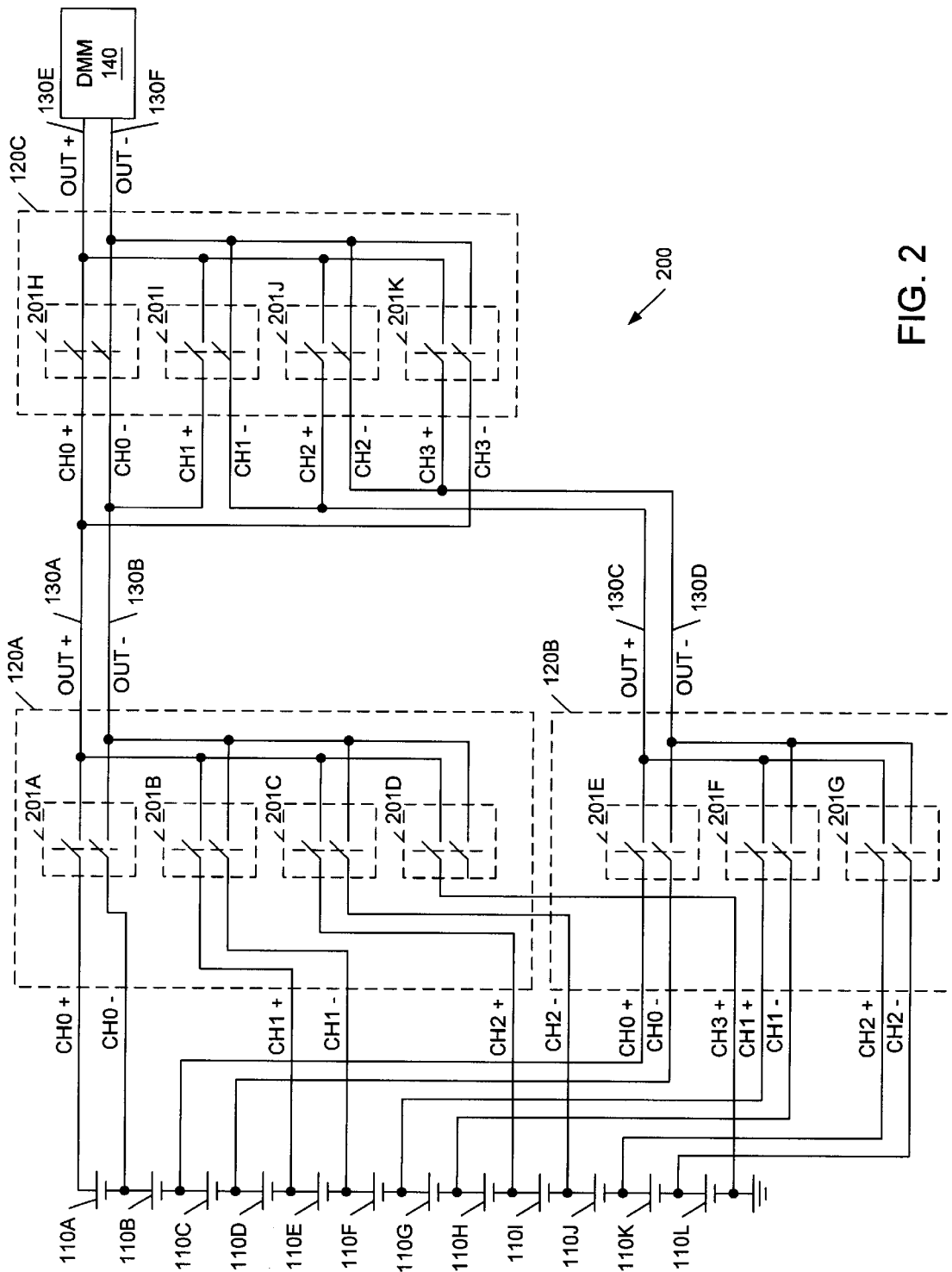
FIG. 2 illustrates the number of two-wire relays in FIG. 1.

Batteries 110 may be tested by connecting a plurality of wires from the positive and negative node of each battery 110 to a plurality of multiplexers located in the first stage. Each multiplexer may be comprised of at least one two-wire relay as illustrated in FIG. 2. The number of two-wire relays may be less than the number of batteries 110 when the number of batteries is eleven or greater. That is, the number of two-wire relays may be equal to:

B/2+4.5 if B is odd
B/2+5 if B is even where B is the number of batteries.

FIG. 1 illustrates an embodiment of how the batteries 110 may be connected to a plurality of multiplexers located in the first stage. FIG. 1 illustrates at least two multiplexers, 120A and 120B, located in the first stage. FIG. 1 further illustrates at least one multiplexer, 120C, located in the second stage. Batteries 110 may be wired to multiplexers, 120A and 120B, in the following manner. The positive and negative node of the first battery, i.e., battery 110A, may be wired to the positive and negative input channel 0 of multiplexer 120A respectively. The positive node of the second battery, i.e., battery 110B, may be wired to the negative input channel 0 of multiplexer 120A. The negative node of the second battery, i.e., battery 110B, may be wired to the positive input channel 0 of multiplexer 120B. The positive and negative node of the third battery, i.e., battery 110C, may be wired to the positive and negative input channel 0 of multiplexer 120B respectively. The positive node of the fourth battery, i.e., battery 110D, may be wired to the negative input channel 0 of multiplexer 120B. The negative node of the fourth battery, i.e., battery 110D, may be wired to the positive input channel 1 of multiplexer 120A. The positive and negative node of the fifth battery, i.e., battery 110E, may be wired to the positive and negative input channel 1 of multiplexer 120A respectively. The positive node of the sixth battery, i.e., battery 110F, may be wired to the negative input channel 1 of multiplexer 120A. The negative node of the sixth battery, i.e., battery 110F, may be wired to the positive input channel 1 of multiplexer 120B. The positive and negative node of the seventh battery, i.e., battery 110G, may be wired to the positive and negative input channel 1 of multiplexer 120B respectively. The positive node of the eighth battery, i.e., battery 110H, may be wired to the negative input channel 1 of multiplexer 120B. The negative node of the eighth battery, battery 110H, may be wired to the positive input channel 2 of multiplexer 120A. The positive and negative nodes of the ninth battery, 110I, may be wired to the positive and negative input channel 2 of multiplexer 120A respectively. The positive node of the tenth battery, 110J, may be wired to the negative input channel 2 of multiplexer 120A. The negative node of the tenth battery, 110J, may be wired to the positive input channel 2 of multiplexer 120B. The positive and negative nodes of the eleventh batter, 110K, may be wired to the positive and negative input channel 2 of multiplexer 120B respectively. The positive node of the twelfth battery, 110L, may be wired to the negative input channel 2 of multiplexer 120B. The negative node of the twelfth battery, 110L, may be wired to the positive input channel 3 of multiplexer 120A. It is noted there may be more than two multiplexers located in the first stage. The number of multiplexers located in the first stage is dependent upon the number of batteries 110 and hence any number of multiplexers in the first stage may be used since any number of batteries may be used.

Multiplexers 120A, 120B and 120C may be referred to collectively as multiplexers 120. Multiplexers 120 may be any type of multiplexer such as a 32×1, 64×1, 96×1 or 128×12 wire multiplexer. Furthermore, multiplexers 120 have a plurality of outputs which may be a high voltage analog bus for both the positive and negative output channels of multiplexers 120. For example, multiplexer 120A has a high voltage analog bus output for its positive output terminal, HVAB1+130A and for its negative output terminal, HVAB1−130B. The high voltage analog bus output for both the positive and negative output terminals of multiplexer 120B is referred to as HVAB3+130C and HVAB3−130D respectively. The high voltage analog bus output for both the positive and negative output terminals of multiplexer 120C is referred to as HVAB0+130E and HVAB0−130F respectively. High voltage analog bus 130A–130F may be collectively referred to as high voltage analog bus 130. High voltage analog bus 130 represents the voltages of particular input channels of multiplexers 120.

The output channels of multiplexers 120A and 120B located in the first stage may be connected to various input channels of multiplexer 120C located in the second stage. The positive output terminal 130A of multiplexer 120A may be connected to input channels, CH0+ and CH3−, of multiplexer 120C. The negative output terminal 130B of multiplexer 120A may be connected to input channels, CH0− and CH1+, of multiplexer 120C. The positive output terminal 130C of multiplexer 120B may be connected to input channels, CH2+ and CH1−, of multiplexer 120C. The negative output terminal 130D of multiplexer 120B may be connected to input channels, CH2− and CH3+, of multiplexer 120C.

Each battery may be associated with a particular combination of input channels of the multiplexers 120 located in the first stage. As noted above, input channel, CH0+, of multiplexer 120A may be wired to the positive node of battery 110A. CH0− of multiplexer 120A may be wired to the negative node of battery 110A. CH0− of multiplexer 120A may be wired to the positive node of battery 110B. CH0+ of multiplexer 120B may be wired to the negative node of battery 110B. CH0+ of multiplexer 120B may be wired to the positive node of battery 110C. CH0− of multiplexer 120B may be wired to the negative node of battery 110C. CH0− of multiplexer 120B may be wired to the positive node of battery 110D. CH1+ of multiplexer 120A may be wired to the negative node of battery 110D. CH1+ of multiplexer 120A may be wired to the positive node of battery 110E. CH1− of multiplexer 120A may be wired to the negative node of battery 110E. CH1− of multiplexer 120A may be wired to the positive node of battery 110F. CH1+ of multiplexer 120B may be wired to the negative node of battery 110F. CH1+ of multiplexer 120B may be wired to the positive node of battery 110G. CH1− of multiplexer 120B may be wired to the negative node of battery 110G. CH1− of multiplexer 120B may be wired to the positive node of battery 110H. CH2+ of multiplexer 120A may be wired to the negative node of battery 110H. CH2+ of multiplexer 120A may be wired to the positive node of battery 110I. CH2− of multiplexer 120A may be wired to the negative node of battery 110I. CH2− of multiplexer 120A may be wired to the positive node of battery 110J. CH2+ of multiplexer 120B may be wired to the negative node of battery 110J. CH2+ of multiplexer 120B may be wired to the positive node of battery 110K. CH2− of multiplexer 120B may be wired to the negative node of battery 110K. CH2− of multiplexer 120B may be wired to the positive node of battery 110L. CH3+ of multiplexer 120A may be wired to the negative node of battery 110L. Hence, battery 110A may be associated with the particular combination of input channels CH0+ and CH0− of multiplexer 120A since both the positive and negative nodes of battery 110A were connected to the input channels CH0+ and CH0− of multiplexer 120A respectively. Battery 110B may be associated with the particular combination of input channel CH0− of multiplexer 120A and input channel CH0+ of multiplexer 120B. Battery 110C may be associated with the particular combination of input channels CH0+ and CH0− of multiplexer 120B. Battery 110D may be associated with the particular combination of input channel CH0− of multiplexer 120B and input channel CH1+ of multiplexer 120A. Battery 110E may be associated with the particular combination of input channels CH1+ and CH1− of multiplexer 120A. Battery 110F may be associated with the particular combination of input channel CH1− of multiplexer 120A and input channel CH1+ of multiplexer 120B. Battery 110G may be associated with the particular combination of input channels CH1+ and CH1− of multiplexer 120B. Battery 110H may be associated with the particular combination of input channel CH1− of multiplexer 120B and input channel CH2+ of multiplexer 120A. Battery 110I may be associated with the particular combination of input channels CH2+ and CH2− of multiplexer 120A. Battery 110J may be associated with the particular combination of input channel CH2− of multiplexer 120A and input channel CH2+ of multiplexer 120B. Battery 110K may be associated with the particular combination of input channels CH2+ and CH2− of multiplexer 120B. Battery 110L may be associated with the particular combination of input channel CH2− of multiplexer 120B and input channel CH3+ of multiplexer 120A.

At least one instrument, such as multimeter, 140, may be connected to output terminals 130E and 130F of multiplexer 120C. Multimeter 140 measures the voltage across the output terminals 130E and 130F. Multimeter 140 may be configured to monitor a charge/discharge state of each of the plurality of batteries 110. Hence, multimeter 140 may be configured to determine the voltages of each of the batteries 110. Any particular type of multimeter would be sufficient. Output terminals 130E and 130F of multiplexer 120C may be associated with the voltages of a particular combination of input channels of multiplexers 120A and 120B located in the first stage. Since each battery 110 may be associated with a particular combination of input channels of multiplexers 120A and 120B, multimeter 140 compares the voltage between a particular combination of input channels of multiplexers 120A and 120B with an expected value. If the voltage of the particular combination of input channels of the multiplexers 120 is not within a known range, then the battery 110 is defective.

Software may reside in a memory in a computer system that selects the particular combination of input channels to measure. For example, software may select the channels, CH0+ and CH0−, of multiplexer 120A to be measured. CH0+ of multiplexer 120A represents the voltage of the positive node of battery 110A. CH0− of multiplexer 120A represents the voltage of the negative node of battery 110A. HVAB1+130A may represent the voltage of CH0+ of multiplexer 120A and HVAB1−130B may represent the voltage of CH0− of multiplexer 120A. Output terminals 130A and 130B are connected to input channels CH0+ and CH0− of multiplexer 120C respectively. Input channels CH0+ and CH0− of multiplexer 120C may be represented at outputs 130E and 130F of multiplexer 120C. Hence, output terminals 130E and 130F of multiplexer 120C may represent input channels CH0+ and CH0− of multiplexer 120A and hence represent the voltage across battery 110A. Other batteries 110 may similarly be measured by multimeter 140. Hence, depending on the particular combination of input channels of multiplexers 120A and 120B that is selected by the software, a particular battery is being measured by multimeter 140.

It is noted that the number of multiplexers 120 in the first stage is dependent upon the number of batteries 110 and hence any number of multiplexers 120 in the first stage may be used since any number of batteries may be used. It is further noted that the number of multimeters 140 is dependent upon the number of multiplexers 120 located in the second stage and hence any number of multimeters 140 may be used. That is, the at least one instrument may comprise a plurality of instruments.

FIG. 2—Battery Test System with Detailed Showing of Two-Wire Relays

FIG. 2 illustrates a battery test system 200 that is identical to battery test system 100 with a detailed showing of the two-wire relays that are comprised within multiplexers 120 of FIG. 1. Two-wire relays select the particular positive or negative input channel of multiplexers 120 to be outputted.

As noted above, the number of two-wire relays may be equal to:

B/2+4.5 if B is odd
B/2+5 if B is even where B is the number of batteries. There is a cost savings in the number of two-wire relays when the number of batteries is eleven or greater. That is, when battery test systems 100 and 200 test eleven or more batteries, the number of two-wire relays is less than the number of batteries. In FIGS. 1 and 2, the number of batteries is equal to twelve. FIG. 2 illustrates that only eleven two-wire relays are implemented instead of twelve. Hence, FIG. 2 demonstrates a savings in the number of two-wire relays.

Multiplexer 120A may comprise four two-wire relays, 201A, 201B, 201C and 201D. The top wire of two-wire relay 201A is connected to the positive input channel 0 of multiplexer 120A. The bottom wire of two-wire relay 201A is connected to the negative input channel 0 of multiplexer 120A. The top wire of two-wire relay 201B is connected to the positive input channel 1 of multiplexer 120A. The bottom wire of two-wire relay 201B is connected to the negative input channel 1 of multiplexer 120A. The top wire of two-wire relay 201C is connected to the positive input channel 2 of multiplexer 120A. The bottom wire of two-wire relay 201C is connected to the negative input channel 2 of multiplexer 120A. The top wire of two-wire relay 201D is connected to the positive input channel 3 of multiplexer 120A.

Multiplexer 120B may comprise three two-wire relays, 201E, 201F, and 201G. The top wire of two-wire relay 201E is connected to the positive input channel 0 of multiplexer 120B. The bottom wire of two-wire relay 201E is connected to the negative input channel 0 of multiplexer 120B. The top wire of two-wire relay 201F is connected to the positive input channel 1 of multiplexer 120B. The bottom wire of two-wire relay 201F is connected to the negative input channel 1 of multiplexer 120B. The top wire of two-wire relay 201G is connected to the positive input channel 2 of multiplexer 120B. The bottom wire of two-wire relay 201G is connected to the negative input channel 2 of multiplexer 120B.

Multiplexer 120C may comprise four two-wire relays, 201H, 201I, 201J and 201K. The top wire of two-wire relay 201H is connected to the positive input channel 0 of multiplexer 120C. The bottom wire of two-wire relay 201H is connected to the negative input channel 0 of multiplexer 120C. The top wire of two-wire relay 201I is connected to the positive input channel 1 of multiplexer 120C. The bottom wire of two-wire relay 201I is connected to the negative input channel 1 of multiplexer 120C. The top wire of two-wire relay 201J is connected to the positive input channel 2 of multiplexer 120C. The bottom wire of two-wire relay 201J is connected to the negative input channel 2 of multiplexer 120C. The top wire of two-wire relay 201K is connected to the positive input channel 3 of multiplexer 120C. The bottom wire of two-wire relay 201K is connected to the negative input channel 3 of multiplexer 120C. Two-wire relays 201A–K may collectively or individually be referred to as two-wire relays 201 or two-wire relay 201 respectively.

It is noted that the number of two-wire relays 201 is dependent upon the number of batteries 110 and hence any number of two-wire relays 201 may be implemented. It is further noted that the number of two-wire relays 201 within multiplexer 120 depends upon the particular type of multiplexer. For example, multiplexers 120A and 120B are 32×12 wire multiplexers. Hence, multiplexers 120A and 120B may comprise a total of 32 2-wire relays 201. Multiplexer 120C is a 4×12 wire multiplexer. Hence, multiplexer 120C may comprise up to 4 two-wire relays 201.

As noted above, two-wire relays 201 select the particular positive or negative input channel of multiplexers 120 to be outputted. For example, software may select the channels, CH0+ and CH0–, of multiplexer 120A to be measured. CH0+ of multiplexer 120A represents the voltage of the positive node of battery 110A. CH0– of multiplexer 120A represents the voltage of the negative node of battery 110A. Consequently, both relays or switches of two-wire relay 201A will be turned on so that the voltages of the positive and negative node of battery 110A will be outputted by multiplexer 120A. Subsequently, HVAB1+130A may represent the voltage of CH0+ of multiplexer 120A and HVAB1– 130B may represent the voltage of CH0– of multiplexer 120A. Output terminals 130A and 130B are connected to input channels CH0+ and CH0– of multiplexer 120C respectively. Input channels CH0+ and CH0– of multiplexer 120C may be represented at outputs 130E and 130F of multiplexer 120C by having both relays or switches of two-wire relay 201H turned on. Hence, output terminals 130E and 130F of multiplexer 120C may represent input channels CH0+ and CH0– of multiplexer 120A and hence represent the voltage across battery 110A. Multimeter 140 connected to the outputs of multiplexer 120C may then measure the voltage across battery 110A. Other batteries 110 may similarly be measured by multimeter 140. Hence, depending on the particular combination of input channels of multiplexers 120A and 120B that is selected by the software, a particular battery is being measured by multimeter 140.

Figure 3:
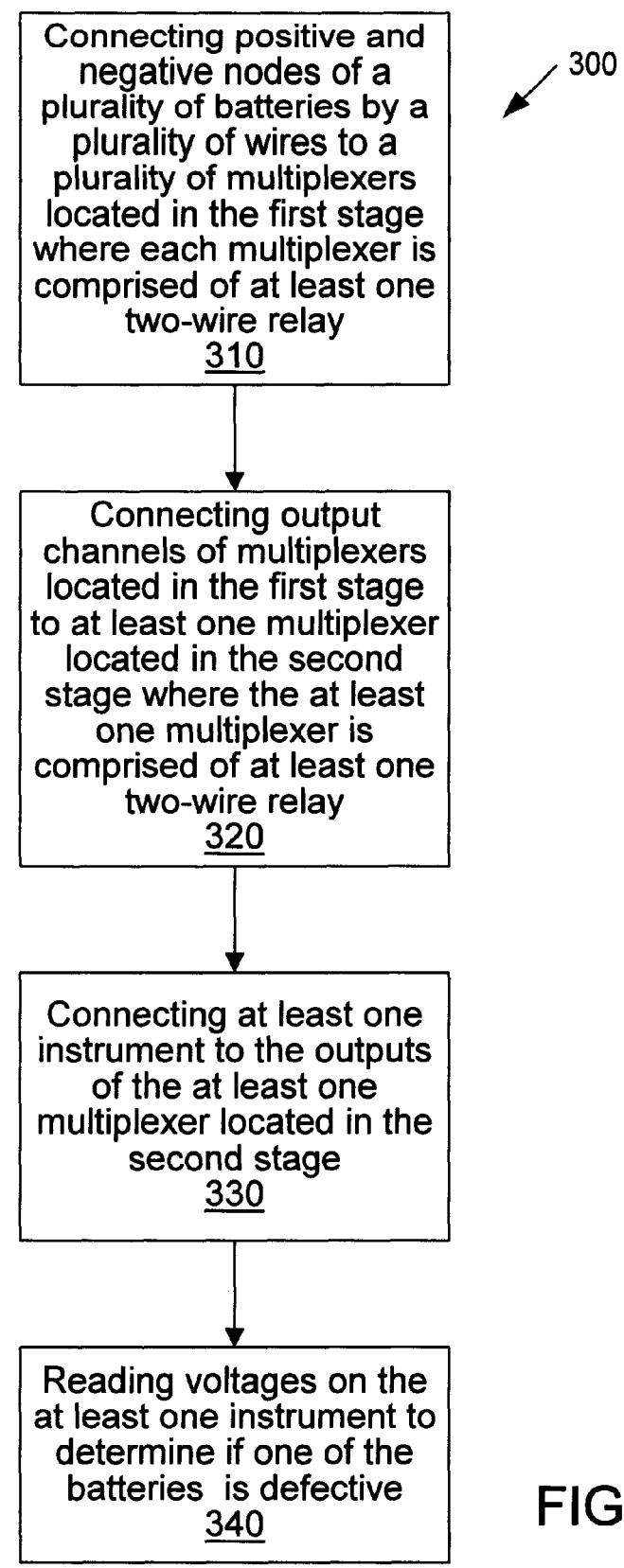
FIG. 3 is a flowchart of a method of testing a plurality of batteries according to the embodiment of FIG. 1.

FIG. 3—Flowchart of Method of Testing Batteries

FIG. 3 is a flowchart depicting a particular method 300 of one embodiment of the present invention of testing batteries 110 connected in series. In step 310, the positive and negative nodes of batteries 110 may be connected to a plurality of multiplexers, 120A and 120B, located in the first stage. Each multiplexer, 120A and 120B, comprises at least one two-wire relay 201. The number of two-wire relays 201 may be less than the number of batteries 110 when the number of batteries 110 is eleven or greater. The number of two-wire relays 201 may be equal to:

B/2+4.5 if B is odd
B/2+5 if B is even where B is the number of batteries.

Batteries 110 may be connected to the plurality of multiplexers, 120A and 120B, in the following manner. As stated above, the positive and negative node of the first battery, i.e., battery 110A, may be wired to the positive and negative input channel 0 of multiplexer 120A respectively. The positive node of the second battery, i.e., battery 110B, may be wired to the negative input channel 0 of multiplexer 120A. The negative node of the second battery, i.e., battery 110B, may be wired to the positive input channel 0 of multiplexer 120B. The positive and negative node of the third battery, i.e., battery 110C, may be wired to the positive and negative input channel 0 of multiplexer 120B respectively. The positive node of the fourth battery, i.e., battery 110D, may be wired to the negative input channel 0 of multiplexer 120B. The negative node of the fourth battery, i.e., battery 110D, may be wired to the positive input channel 1 of multiplexer 120A. The positive and negative node of the fifth battery, i.e., battery 110E, may be wired to the positive and negative input channel 1 of multiplexer 120A respectively. The positive node of the sixth battery, i.e., battery 110F, may be wired to the negative input channel 1 of multiplexer 120A. The negative node of the sixth battery, i.e., battery 110F, may be wired to the positive input channel 1 of multiplexer 120B. The positive and negative node of the seventh battery, i.e., battery 110G, may be wired to the positive and negative input channel 1 of multiplexer 120B respectively. The positive node of the eighth battery, i.e., battery 110H, may be wired to the negative input channel 1 of multiplexer 120B. The negative node of the eighth battery, battery 110H, may be wired to the positive input channel 2 of multiplexer 120A.

In step 320, the outputs of multiplexers, 120A and 120B, located in the first stage, may be coupled to multiplexer 120C, located in the second stage. Multiplexer 120C comprises at least one two-wire relay 201. The output channels of multiplexers, 120A and 120B, may be connected to various input channels of multiplexer 120C. As stated above, output terminal 130A of multiplexer 120A may be connected to input channels, CH0+ and CH3−, of multiplexer 120C. Output terminal 130B of multiplexer 120A may be connected to input channels, CH0− and CH1+, of multiplexer 120C. Output terminal 130C of multiplexer 120B may be connected to input channels, CH2+ and CH1−, of multiplexer 120C. Output terminal 130D of multiplexer 120B may be connected to input channels, CH2− and CH3+, of multiplexer 120C. The voltages of a particular combination of input channels to multiplexers 120A and 120B may be outputted on their output channels which may then be inputted to the input channels of multiplexer 120C.

In step 330, at least one instrument, such as a multimeter 140, may be connected to the output channels of multiplexer 120C. The output channels of multiplexer 120C may represent a particular combination of input channels to multiplexer 120C which may represent a particular combination of input channels to multiplexers 120A and 120B.

In step 340, the at least one instrument, such as multimeter 140, reads the voltages between the output channels of multiplexer 120C which represent a particular combination of input channels of multiplexers, 120A and 120B. Since each battery may be associated with a particular combination of input channels of multiplexers 120A and 120B, multimeter 140 compares the voltage between a particular combination of input channels of multiplexers, 120A and 120B, within a known range. If the voltage of the particular combination of input channels of multiplexers, 120A and 120B, is not within the known range, then that particular battery is defective.

Figure 4:
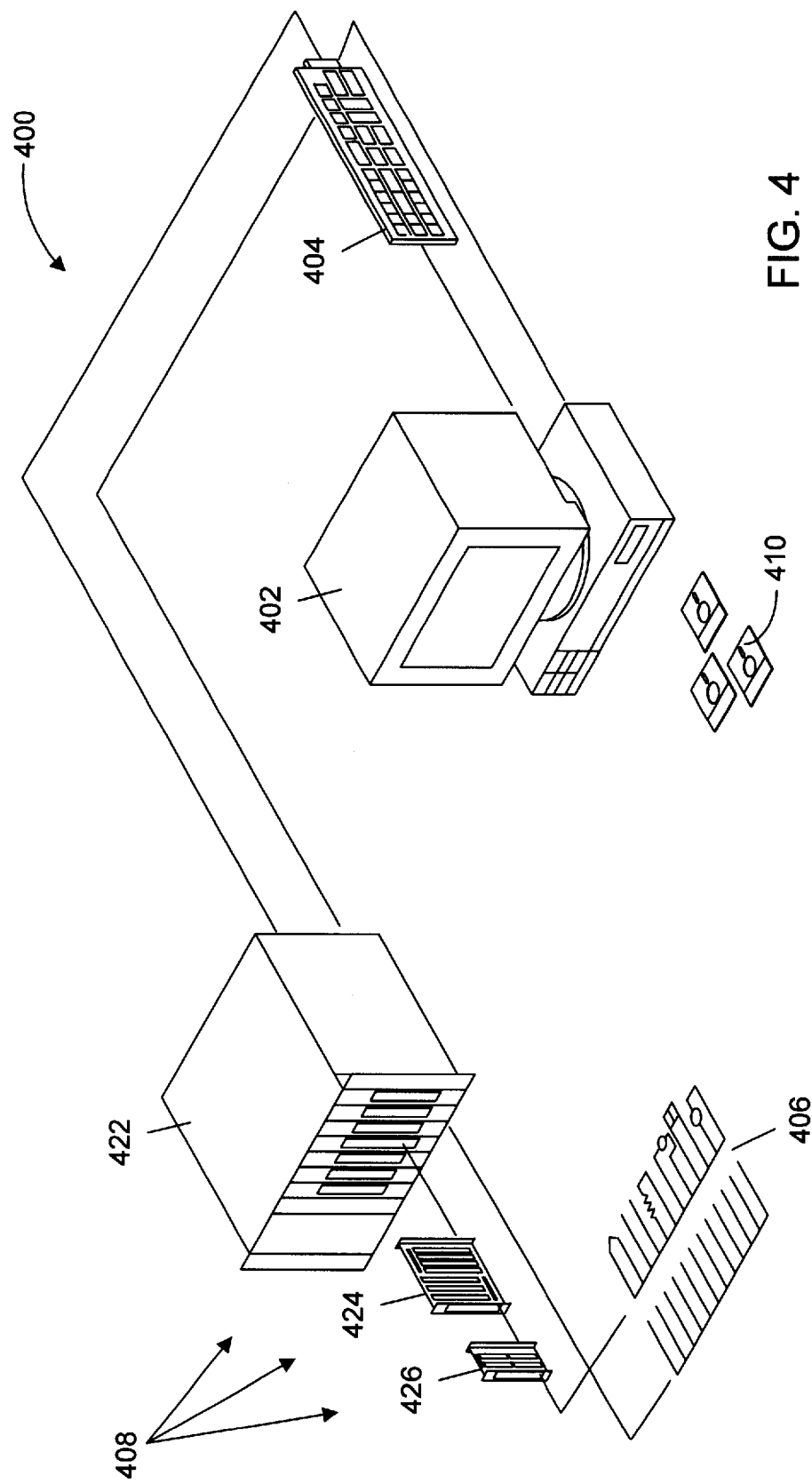
FIG. 4 illustrates an instrumentation system which includes an embodiment of the battery testing system.

FIG. 4—Computer System

FIG. 4 illustrates a computer-based instrumentation system 400 implementing an embodiment of the battery test system. The battery testing system of the present invention is preferably comprised in the computer-based instrumentation system 400. However, the battery testing system of the present invention may also be comprised in a standard handheld or benchtop instrument, such as a standard multimeter, or in any of various other systems which use a battery testing system. Examples of systems where the battery testing system may be used include instrumentation systems, industrial automation systems, audio systems, telephony systems, video systems, and other systems where battery testing is performed. Thus FIG. 4 is an example of one embodiment, and the present invention may be used in any of various systems.

The instrumentation system 400 comprises a computer 402 having an operating system and other software, an instrumentation device or board 404 coupled to the computer 402, and transducers 406 or other detecting means which provide field electrical signals to/from the instrumentation device 404 through signal conditioning logic 408.

The computer 402 includes various standard components, including at least one central processing unit (CPU), memory, a non-volatile memory, one or more buses, and a power supply. The computer also stores software programs, represented by medium 410. In one embodiment, the computer 402 comprises input/output (I/O) slots into which the instrumentation device 404 is coupled.

In the embodiment of FIG. 4, the instrumentation device 404 is a board or card adapted for insertion into an expansion slot of the computer system 402. The board 404 is shown external to the computer system 402 in FIG. 4 for illustrative purposes. in another embodiment, the instrumentation device 404 is external to the computer 402. For example, the device 404 may be coupled to the computer 402 by a VXI (VME Extensions for Instrumentation) chassis and bus, a GPIB (General Purpose Interface Bus), a serial bus or port, e.g., USB or IEEE 1394, a parallel port, or other type of bus or cabling. The instrumentation device 404 may be any of various types, such as a data acquisition (DAQ) device or card, a multimeter card, a voltmeter card, etc. In an embodiment of FIG. 4, the instrument device 404 may function as at least one instrument, such as multimeter 140, as illustrated in FIG. 1.

The transducers 406 are optionally conditioned by the signal conditioning circuitry 408 for presentation to the device 404 as shown. The transducers 406 detect the voltages of the positive and negative nodes of batteries 110. In the embodiment of FIG. 4, the signal conditioning circuitry 408 comprises an SCXI (Signal Conditioning Extensions for Instrumentation) chassis 422, one or more SCXI modules 424, and one or more SCXI terminal blocks 426. SCXI is an open architecture, multi-channel signal conditioning front-end system for instrumentation devices. SCM comprises an external chassis housing signal conditioning modules for amplifying, multiplexing, and isolating field signals. The signal conditioning modules advantageously reduce the introduction of noise into the signals transmitted to the device 404. The signal conditioning circuitry 408 receives the voltage signals of the batteries 110 by wiring the positive and negative nodes of batteries 110 to a plurality of multiplexers, 120A and 120B, located in the first stage as illustrated in FIG. 1 within signal conditioning module 424. Multiplexer, 120C, located in the second stage may also be comprised within signal conditioning module 424. The backplane of SCXI chassis 422 comprises the high voltage analog bus 130 which may be connected to the outputs of multiplexers 120. The high voltage analog bus 130 of multiplexer 120C, located in the second stage, may be connected to the instrument device 404.

The transducers 406 and other detecting means provide the field signals representing a process, physical phenomena, equipment being monitored or measured, etc. to/from the instrumentation device 404. Examples of the transducers 406 are strain gauges, thermocouples, thermistors, photoconductive cells, microphones, and piezoelectric transducers, among others.

Figure 5:
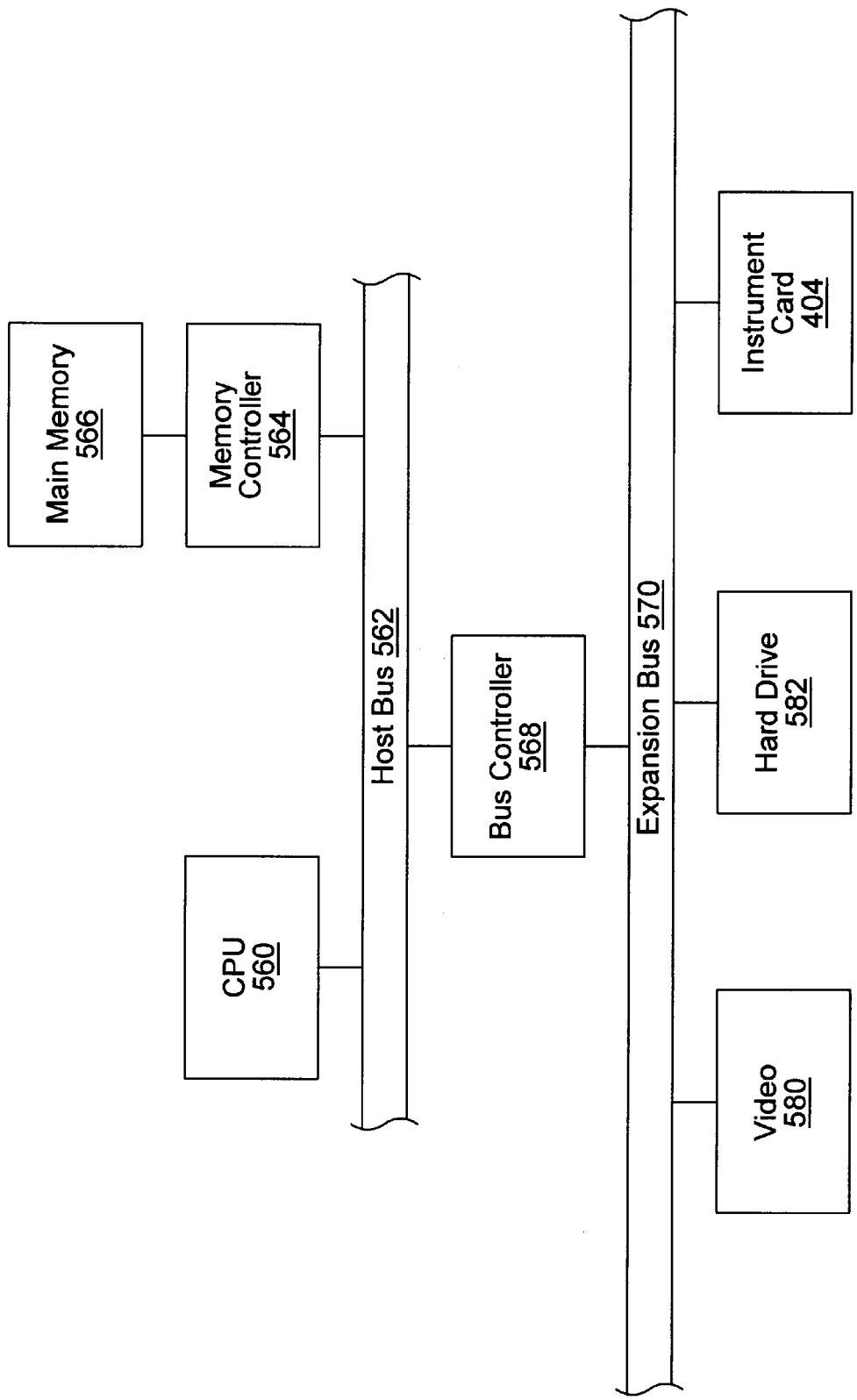
FIG. 5 is a block diagram illustrating the computer system in the instrumentation system of FIG. 4.

FIG. 5—Block Diagram of Computer System

FIG. 5 is a block diagram of the computer system 402 of FIG. 4. The elements of a computer not necessary to understand the operation of the present invention have been omitted for simplicity. Also, the computer 402 may have various architectures.

The computer 402 includes at least one central processing unit or CPU 560 which is coupled to a processor or host bus 562. The CPU 560 may be any of various types, including an x86 processor, a PowerPC processor, a CPU from the Motorola family of processors, a CPU from the SPARC family of RISC processors, as well as others. Main memory 566 is coupled to the host bus 562 by means of memory controller 564. The main memory 566 may store application software for controlling the instrumentation system. The main memory 566 also stores operating system software as well as other software for operation of the computer system, as well known to those skilled in the art. The main memory 566 may also store software for performing a portion of the analog to digital conversion function according to the present invention.

The host bus 562 is coupled to an expansion or input/output bus 570 by means of a bus controller 568 or bus bridge logic. The expansion bus 570 is preferably the PCI (Peripheral Component Interconnect) expansion bus, although other bus types can be used. The expansion bus 570 includes slots for various devices such as the instrumentation board 404. The instrumentation board 404 may comprise a data acquisition board, a multimeter board, i.e., a board which implements multimeter functions, an oscilloscope board, or other type of instrumentation board. The computer 402 further comprises a video display subsystem 580 and hard drive 582, which may be coupled to the expansion bus 570.

As noted above, the instrumentation device 404 preferably functions as at least one instrument, such as multimeter 140, as illustrated in FIG. 1. It is noted that the instrumentation device may function as a plurality of multimeters. As noted above, the battery test system and method of the present invention may be included in any of various systems. Thus FIGS. 4 and 5 illustrate one example of the use of the present invention.

Figure 6:
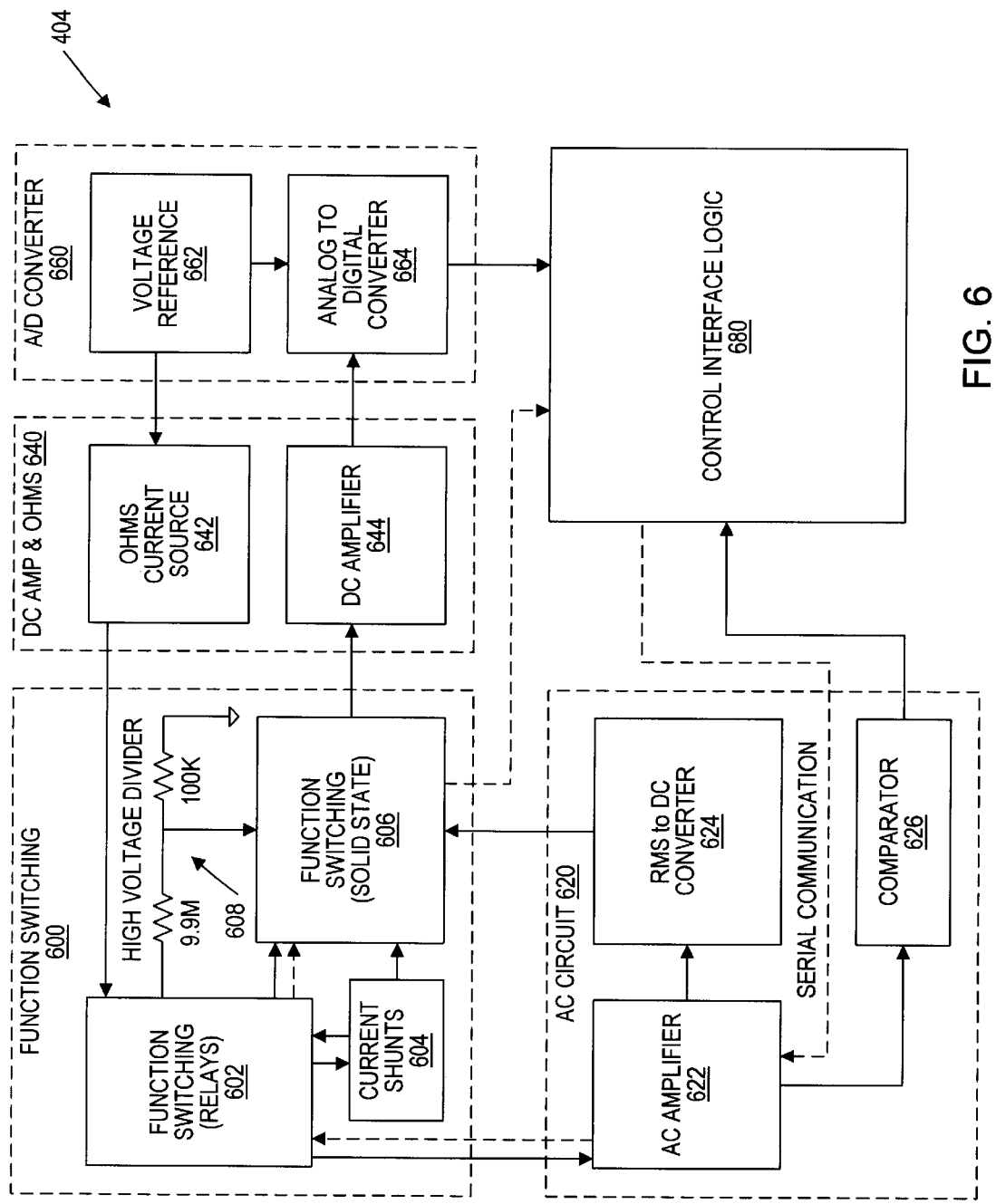
FIG. 6 is a block diagram of the instrumentation device of FIG. 5.

FIG. 6—Block Diagram of Instrumentation Device

FIG. 6 is a block diagram illustrating a portion of the instrumentation device 404 of FIG. 5 in one embodiment, wherein the instrumentation device 404 functions as a multimeter. It is noted that FIG. 6 is exemplary only, and the instrumentation device 404 may have various architectures or forms, as desired. As noted above, the function of performing as at least one instrument, such as multimeter 140, may be included in any of various devices, as desired.

As shown, the instrumentation device 404 includes a function switching block 600, an AC circuit 620, a DC amplifier and ohm block 640, an A/D converter block 660 and control interface logic 680.

The function switching block 600 operates to switch between the various functions performed by the multimeter, such as voltage measurement, current measurement, DC/AC measurements, etc. The function switching logic 600 includes a function switching block 602 comprising a plurality of relays. The function switching block 602 couples to a high voltage divider 608. The function switching block 602 also couples to current shunts 604. The current shunts block 604 couples to function switching logic 606, which preferably comprises solid state logic.

The function switching block 602 also couples to the AC circuit 620. More specifically, the function switching block 602 couples to an AC amplifier 622. The AC amplifier provides an output to a comparator 626. The comparator 626 in turn provides an output to the control interface logic 680. The AC amplifier 622 is also preferably in serial communication with the control interface logic 680. The AC amplifier 622 also provides an output to an RMS to DC converter 624. The RMS to DC converter 624 operates to convert the root-mean-square (RMS) amplitude of an AC signal to a DC value. The RMS to DC converter 624 provides its output to the solid state function switching logic 606.

As shown, the instrumentation device 404 also includes the DC amplifier and ohm section 640. This block includes an ohms current source 642 and a DC amplifier 644.

The instrumentation device 404 also includes the A/D converter block 660. The A/D converter block 660 includes a voltage reference block 662 and an analog to digital (A/D) converter 664 according to the present invention.

The voltage reference block 662 provides an output to the ohms current source block 642 which in turn provides an output to the function switching relays 602. The solid state function switching block 606 receives an output from the high voltage divider 608 as well as from the relay function switching logic 602 and the current shunts 604 and provides an output to the DC amplifier 644 which in turn provides an output to the A/D converter 664. The solid state function switching block 606 and the A/D converter 664 are also coupled to the control interface logic 680.

The control interface logic 680 includes logic for controlling access to the computer display for displaying the acquired signals. For example, the control interface logic 680 includes expansion bus interface logic, e.g., PCI bus interface logic, for interfacing to the PCI expansion bus 570.

Although the system and method of the present invention is described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims.

We claim:

1. A test system for testing a plurality of batteries, wherein each of the batteries include positive and negative nodes connected in series, the system comprising:

a plurality of multiplexers connected to each battery, wherein each of the plurality of multiplexers comprise at least one two-wire relay, wherein the number of two-wire relays is less than the number of the plurality of batteries;

a plurality of wires connecting positive and negative nodes of each of the plurality of batteries to the plurality of multiplexers;

at least one instrument connected to outputs of at least one multiplexer of the plurality of multiplexers, wherein the at least one instrument is configured to receive a voltage from the plurality of batteries, wherein the at least one instrument is operable to test each of the plurality of batteries.

2. The test system as recited in claim 1, wherein the number of two-wire relays is equal to:

B/2+4.5 if B is odd

B/2+5 if B is even where B is the number of the plurality of batteries.

3. The test system as recited in claim 2, wherein the plurality of multiplexers are located in two stages, wherein at least two multiplexers are located in a first stage, wherein at least one multiplexer is located in a second stage, wherein the at least one instrument is connected to the at least multiplexer located in the second stage.

4. The test system for testing a plurality of batteries as recited in claim 3, wherein the positive and negative nodes of a first selected batteries are connected to a plurality of input channels of a first multiplexer in the first stage, wherein each input channel is connected to a particular two-wire relay;

wherein the positive and negative nodes of a second selected batteries are connected to a plurality of input channels of a second multiplexer in the first stage, wherein each input channel is connected to a particular two-wire relay.

5. The test system for testing a plurality of batteries as recited in claim 4,
wherein a negative node of a first battery is connected to a positive node of a second neighboring battery;
wherein a particular wire is connected between the negative node of the first battery and the positive node of the second neighboring battery.

6. The test system for testing a plurality of batteries as recited in claim 5,
wherein a positive node of a third battery is connected to a negative node of the second neighboring battery;
wherein a particular wire is connected between the positive node of the third battery and the negative node of the second neighboring battery.

7. The test system for testing a plurality of batteries as recited in claim 6,
wherein each of the plurality of batteries is associated with a selectable combination of the plurality of input channels of the first and second multiplexer located in the first stage.

8. The test system for testing a plurality of batteries as recited in claim 7,
wherein the at least one instrument is operable to monitor a charge/discharge state of each of the plurality of batteries, wherein the at least one instrument is operable to determine a defective battery from each of the plurality of batteries.

9. The test system for testing a plurality of batteries as recited in claim 8,
wherein the at least one instrument measures a voltage between the selectable combination of input channels of the first and second multiplexer located in the first stage,
wherein if the voltage between the selectable combination of input channels is not within a known range, then a battery associated with that selectable combination of input channels is defective.

10. The test system for testing a plurality of batteries as recited in claim 9,
wherein the first and second multiplexer located in the first stage are programmable to selectively provide signals from the plurality of batteries to the at least one multiplexer in the second stage, wherein the at least one instrument connected to the output of the at least one multiplexer in the second stage is operable to individually test each of the plurality of batteries.

11. The test system for testing a plurality of batteries as recited in claim 10, wherein the at least one instrument comprises a plurality of instruments.

12. The test system for testing a plurality of batteries as recited in claim 11, wherein the plurality of wires connect the positive and negative nodes of the first and a fifth battery to the plurality of input channels of the first multiplexer located in the first stage, wherein the plurality of wires connect the positive and negative nodes of the third and a seventh battery to the plurality of input channels of the second multiplexer of the first stage, wherein the plurality of wires connect the positive node of the second and a sixth battery to the plurality of input channels of the first multiplexer located in the first stage, wherein the plurality of wires connect the negative node of the second and sixth battery to the plurality of input channels of the second multiplexer located in the first stage, wherein the plurality of wires connect the positive node of a fourth and eighth battery to the plurality of input channels of the second multiplexer located in the first stage, wherein the plurality of wires connects the negative node of the fourth and eighth battery to the plurality of input channels of the first multiplexer located in the first stage.

13. The test system as recited in claim 12, wherein the test system comprises:
a signal conditioning module, wherein the signal conditioning module comprises the plurality of multiplexers located in two stages, wherein the plurality of multiplexers located in the first stage are connected to each of the plurality of batteries;
a data acquisition card, wherein the data acquisition card is configured to perform as the at least one instrument, wherein the data acquisition card is connected to the signal conditioning module, wherein the data acquisition card is configured to receive the voltage from the plurality of batteries, wherein the data acquisition card is operable to determine a defective battery from the plurality of batteries.

14. A method of testing a plurality of batteries, wherein each of the batteries include positive and negative nodes connected in series, comprising:
connecting the positive and the negative node of the plurality of batteries by a plurality of wires to a plurality of multiplexers, wherein each of the plurality of multiplexers is comprised of at least one two-wire relay, wherein the plurality of two-wire relays is less than the number of the plurality of batteries;
connecting at least one instrument to outputs of at least one multiplexer of the plurality of the multiplexers, wherein the at least one instrument is configured to receive a voltage from the plurality of batteries, wherein the at least one instrument is operable to test each of the plurality of batteries.

15. The method for testing a plurality of batteries as recited in claim 14, wherein the number of two-wire relays is equal to:
B/2+4.5 if B is odd
B/2+5 if B is even
where B is the number of the plurality of batteries.

16. The method as recited in claim 15, wherein the plurality of multiplexers are located in two stages, wherein at least two multiplexers are located in a first stage, wherein at least one multiplexer is located in a second stage, wherein the at least one instrument is connected to the at least one multiplexer located in the second stage.

17. The method for testing a plurality of batteries as recited in claim 16, wherein the positive and negative nodes of a first and fifth battery are connected to input channels of a first multiplexer located in the first stage, wherein the positive and negative nodes of a third and seventh battery are connected to input channels of a second multiplexer located in the first stage, wherein the positive nodes of a second and sixth battery are connected to input channels of the first multiplexer located in the first stage, wherein the negative nodes of the second and sixth battery are connected to input channels of the second multiplexer located in the first stage, wherein the positive nodes of a fourth and eighth battery are connected to input channels of the second multiplexer located in the first stage, wherein the negative nodes of the fourth and eighth battery are connected to input channels of the first multiplexer located in the first stage.

18. The method as recited in claim 17, wherein each of the plurality of batteries is associated with a selectable combination of the plurality of input channels of the first and second multiplexer located in the first stage.

19. The method as recited in claim 18, wherein the at least one instrument measures a voltage between the selectable combination of input channels of the first and second multiplexer located in the first stage, wherein if the voltage between the selectable combination of input channels is not within a known range, then a battery associated with that selectable combination of input channels is defective.

20. The method as recited in claim 19, wherein the at least one instrument comprises a plurality of instruments.

* * * * *